(12) United States Patent
Lin et al.

(10) Patent No.: US 7,313,262 B2
(45) Date of Patent: Dec. 25, 2007

(54) APPARATUS FOR VISUALIZATION OF PROCESS CHAMBER CONDITIONS

(75) Inventors: Chien-Fang Lin, Pingtung (TW); Chung-Yuan Lin, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 756 days.

(21) Appl. No.: 10/636,076

(22) Filed: Aug. 6, 2003

(65) Prior Publication Data

US 2005/0031187 A1    Feb. 10, 2005

(51) Int. Cl.
*G06K 9/00*    (2006.01)
(52) U.S. Cl. ............... 382/145; 118/719; 219/121.41; 414/935
(58) Field of Classification Search ............... 382/145; 137/501; 210/195.1, 232; 118/719, 715, 118/728, 729, 712; 219/121.43, 121.41; 414/936, 939, 217, 935, 937
See application file for complete search history.

(56) References Cited

U.S. PATENT DOCUMENTS

| | | | | |
|---|---|---|---|---|
| 5,292,393 A | * | 3/1994 | Maydan et al. | 156/345.32 |
| 5,421,889 A | * | 6/1995 | Pollock et al. | 118/719 |
| 5,798,137 A | * | 8/1998 | Lord et al. | 427/213 |
| 6,258,408 B1 | * | 7/2001 | Madan et al. | 427/255.5 |
| 6,424,733 B2 | * | 7/2002 | Langley | 382/145 |
| 6,467,187 B2 | * | 10/2002 | Kato et al. | 34/92 |
| 6,591,161 B2 | * | 7/2003 | Yoo et al. | 700/218 |
| 6,982,178 B2 | * | 1/2006 | LeCain et al. | 438/22 |

* cited by examiner

*Primary Examiner*—Sheela Chawan
(74) *Attorney, Agent, or Firm*—Tung & Associates

(57) ABSTRACT

An apparatus and method for visualization of process conditions in a process chamber or chambers, particularly during the fabrication of integrated circuits on substrates in the process chambers. The apparatus includes an inspection chamber which is installed adjacent to a process chamber. A camera provided in the inspection chamber is used to view the interior of the process chamber as the etching, chemical vapor deposition or other process is carried out in the process chamber. A video monitor is typically connected to the camera for viewing images from the camera. In the event that a defect-precipitating event occurs in the process chamber, such as a mechanical malfunction or accumulation of excessive levels of polymer deposition on the chamber walls, the event is displayed on the monitor in real-time.

20 Claims, 1 Drawing Sheet

APPARATUS FOR VISUALIZATION OF PROCESS CHAMBER CONDITIONS

FIELD OF THE INVENTION

The present invention relates to process chambers used in the fabrication of integrated circuits on semiconductor wafer substrates. More particularly, the present invention relates to an apparatus which facilitates real-time visualization and monitoring of conditions inside a process chamber as a process is carried out in the chamber.

BACKGROUND OF THE INVENTION

In the semiconductor production industry, various processing steps are used to fabricate integrated circuits on a semiconductor wafer. These steps include the deposition of layers of different materials including metallization layers, passivation layers and insulation layers on the wafer substrate, as well as photoresist stripping and sidewall passivation polymer layer removal. In modern memory devices, for example, multiple layers of metal conductors are required for providing a multi-layer metal interconnection structure in defining a circuit on the wafer. Chemical vapor deposition (CVD) processes are widely used to form layers of materials on a semiconductor wafer. Other processing steps in the fabrication of the circuits include formation of a photoresist or other mask such as titanium oxide or silicon oxide, in the form of the desired metal interconnection pattern, using standard lithographic techniques; subjecting the wafer substrate to a dry etching process to remove the conducting layer from the areas not covered by the mask, thereby leaving the metal layer in the form of the masked pattern; removing the mask layer using reactive plasma and chlorine gas, thereby exposing the top surface of the metal interconnect layer; cooling and drying the wafer substrate by applying water and nitrogen gas to the wafer substrate; and removing or stripping polymer residues from the wafer substrate.

CVD processes include thermal deposition processes, in which a gas is reacted with the heated surface of a semiconductor wafer substrate, as well as plasma-enhanced CVD processes, in which a gas is subjected to electromagnetic energy in order to transform the gas into a more reactive plasma. Forming a plasma can lower the temperature required to deposit a layer on the wafer substrate, to increase the rate of layer deposition, or both. However, in plasma process chambers used to carry out these various CVD processes, materials such as polymers are coated onto the chamber walls and other interior chamber components and surfaces during the processes. These polymer coatings frequently generate particles which inadvertently become dislodged from the surfaces and contaminate the wafers.

The chemical vapor deposition, etching and other processes used in the formation of integrated circuits on the wafer substrate are carried out in multiple process chambers. The process chambers are typically arranged in the form of an integrated cluster tool, in which multiple process chambers are disposed around a central transfer chamber equipped with a wafer transport system for transporting the wafers among the multiple process chambers. By eliminating the need to transport the wafers large distances from one chamber to another, cluster tools facilitate integration of the multiple process steps and improve wafer manufacturing throughput.

A typical conventional integrated cluster tool is generally indicated by reference numeral 10 in FIG. 1. An integrated cluster tool 10 such as a Centura HP 5200 tool sold by the Applied Materials Corp. of Santa Clara, Calif., includes one or a pair of adjacent loadlock chambers 12, each of which receives a wafer cassette or holder 13 holding multiple semiconductor wafers 28. The loadlock chambers 12 are flanked by an orientation chamber 14 and a cooldown chamber 16. Multiple process chambers 18 for carrying out various processes in the fabrication of integrated circuits on the wafers 28 are positioned with the orientation chamber 14, the cooldown chamber 16 and the loadlock chambers 12 around a central transfer chamber 20. A transfer robot 22 in the transfer chamber 20 is fitted with a transfer blade 24 which receives and supports the individual wafers 28 from the wafer cassette or holder 13 in the loadlock chamber 12. The transfer robot 22 is capable of rotating the transfer blade 24 in the clockwise or counterclockwise direction in the transfer chamber 20, and the transfer blade 24 can extend or retract to facilitate placement and removal of the wafers 28 in and from the load lock chambers 12, the orientation chamber 14, the cooldown chamber 16 and the process chambers 18.

In operation, the transfer blade 24 initially removes a wafer 28 from the wafer cassette 13 and then inserts the wafer 28 in the orientation chamber 14. The transfer robot 22 then transfers the wafer 28 from the orientation chamber 14 to one or more of the process chambers 18, where the wafer 28 is subjected to a chemical vapor deposition or other process. From the process chamber 18, the transfer robot 22 transfers the wafer 28 to the cooldown chamber 16, and ultimately, back to the wafer cassette or holder 13 in the loadlock chamber 12.

After they are processed in the various process chambers of the cluster tool, some of the wafers are sampled for inspection, with the sampling rate and selection method based on the process involved. Typically, the sampled wafers are transported from the cluster tool to an inspection station and inspected for surface defects, line width, electrical functions and the like. U.S. Pat. No. 6,424,733, details an apparatus which is incorporated into a cluster tool for the inspection of wafers.

It is known that some of the processes utilized in the integrated circuit fabrication process differ from each other in stability. The processes which are deemed most stable do not exhibit large variations in the process parameters over time after the parameters are initially adjusted to within the inspection criteria. Thus, the process chambers in which these processes are carried out may be able to operate for days at a time without the need for adjustments and fine-tuning to return the process parameters to within the predetermined specifications. Consequently, these stable processes do not require a high sampling rate for inspection. On the other hand, less stable processes are more likely to veer from within the predetermined specifications and thus, require frequent sampling in order for corrective measures to the processes to be taken.

Wafers are generally processed in lots each having from 20 to 25 wafers. If the sampling rate for a given process is low, the process may inadvertently veer from the preset specifications unbeknownst to the equipment operating personnel, in which case a large number of wafers having defects may complete processing. These defects may be caused by mechanical failures such as a blown o-ring or adverse processing phenomena such as electrical arcing, for example.

Another common cause of process-related defects induced in substrates includes the dislodging of etchant or deposition polymer material from the walls of the chamber onto the substrate. If this occurs early in the first lot or shortly after a sampling, for example, the defect-causing event may be eventually ascertained by facility personnel only after a large number of defect-laden substrates have been processed. While a higher sampling rate would enable personnel to discover the cause for the defects earlier in the process, sampling tends to inhibit productivity, and thus, is best avoided when possible.

Due to the ever-decreasing size of device features in fabricated integrated circuits, IC manufacturers are required to detect defects of corresponding reduced size. The defect detection equipment used for this purpose, however, is typically expensive and occupies an inordinately large footprint space. Moreover, transfer of the substrates from the process tool to an inspection station requires handling equipment which occupies additional footprint space and the operation of which may introduce additional contaminants onto the devices on the substrates. Accordingly, an apparatus is needed for the real-time visualization of operating conditions inside process chambers to enable personnel to take corrective action in the event that defect-precipitating events occur in the chamber during semiconductor processing.

An object of the present invention is to provide a novel apparatus for visualization of conditions inside a process chamber.

Another object of the present invention is to provide a novel apparatus which may be adapted to record real-time images of conditions inside a process chamber.

Still another object of the present invention is to provide a novel apparatus which may be adapted to visualize or monitor conditions inside multiple process chambers.

Yet another object of the present invention is to provide a novel apparatus which may be adapted to enable semiconductor fabrication facility personnel to troubleshoot various process conditions during the fabrication of semiconductor integrated circuits.

A still further object of the present invention is to provide a novel apparatus which may reduce the frequency of periodic maintenance for process chambers.

Still another object of the present invention is to provide a novel apparatus including an inspection chamber which may be installed adjacent to a process chamber and a camera provided in the inspection chamber for viewing process conditions in the process chamber.

SUMMARY OF THE INVENTION

In accordance with these and other objects and advantages, the present invention is generally directed to a novel apparatus for visualization of process conditions in a process chamber or chambers, particularly during the fabrication of integrated circuits on substrates in the process chambers. The apparatus includes an inspection chamber which is installed adjacent to a process chamber. A camera provided in the inspection chamber is used to view the interior of the process chamber as the etching, chemical vapor deposition or other process is carried out in the process chamber. A video monitor is typically connected to the camera for viewing images from the camera. In the event that a defect-precipitating event occurs in the process chamber, such as a mechanical malfunction or accumulation of excessive levels of polymer deposition on the chamber walls, the event is displayed on the monitor in real-time. Accordingly, personnel operating the process tool can take appropriate corrective or preventative measures to reduce or prevent the inducement of defects in the devices being fabricated on the substrate or substrates in the process chamber.

The apparatus of the present invention may further be used in conjunction with a cluster tool for the sequential processing of semiconductor wafer substrates. Accordingly, an inspection chamber is attached typically to the transfer chamber or buffer chamber of the cluster tool and a camera is provided in the inspection chamber. The camera is preferably a panaramic camera such as a charged-coupled device (CCD) which facilitates simultaneous viewing of multiple process chambers in the cluster tool. Accordingly, the camera views the interior of each process chamber typically through a wafer transfer slot provided in each chamber, from inside the transfer chamber or buffer chamber. These images are typically transmitted to a monitor for real-time viewing by tool operating personnel.

The apparatus of the present invention may be further provided with a motion actuating mechanism which is operably connected to the camera. The motion actuating mechanism may be actuated to advance the camera from the inspection chamber into the transfer chamber or buffer chamber. The camera may be fitted with a zoom lens for zooming in on the process chamber, or a selected one of the multiple process chambers in the case of a cluster tool, for detailed visualization of processing conditions inside the selected chamber.

The apparatus may further be provided with a catch head including an electrostatic chuck head and adhesive tape on the camera. The catch head may be used to remove foreign powders or particles from the bottom of the inspection chamber during use.

BRIEF DESCRIPTION OF THE DRAWINGS

The invention will now be described, by way of example, with reference to the accompanying drawings, in which.

DESCRIPTION OF THE PREFERRED EMBODIMENTS

The present invention has particularly beneficial utility in the viewing of process conditions inside process chambers used in the fabrication of integrated circuits on substrates. However, the invention is not so limited in application, and while references may be made to such process chambers for processing of semiconductor integrated circuits, the invention may be more generally applicable to viewing of process conditions inside process chambers in a variety of industrial and mechanical applications.

Figure 1:
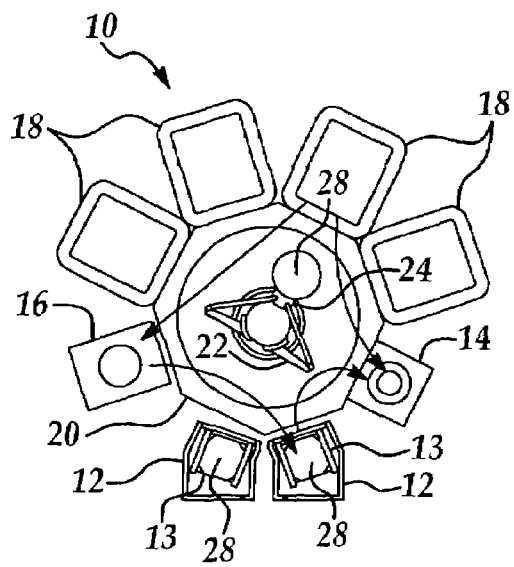
FIG. 1 is a top view of a typical conventional cluster tool for the sequential processing of semiconductor wafer substrates.
Figure 2:
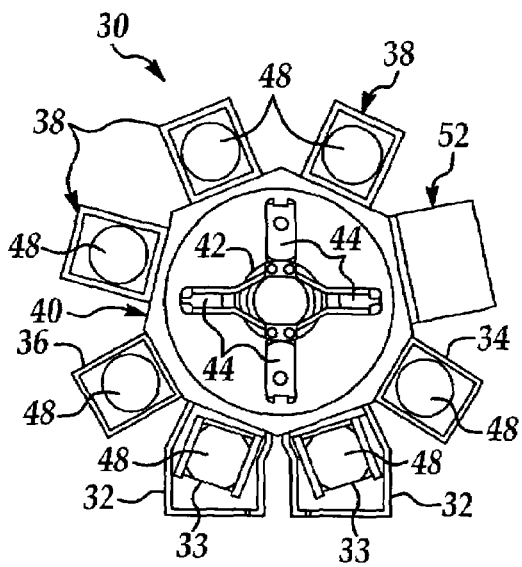
FIG. 2 is a top view of a cluster tool in implementation of the present invention.
Figure 3:
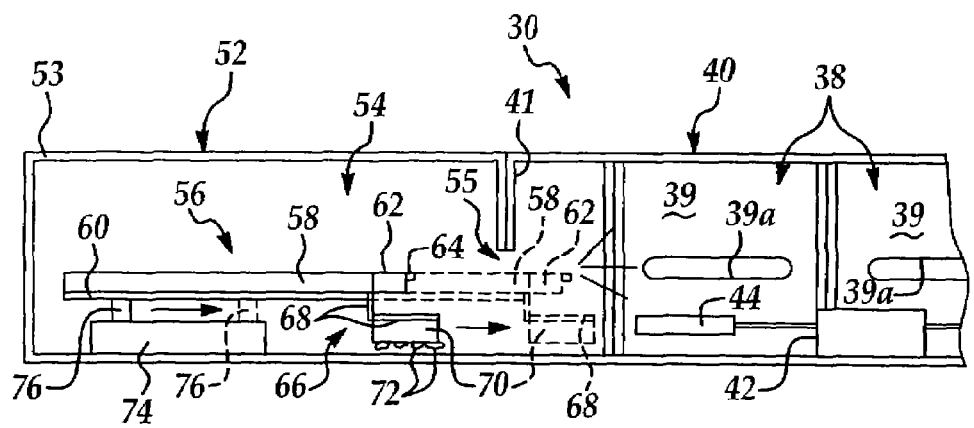
FIG. 3 is a cross-sectional view, taken along section lines 3-3 in FIG. 2.
Figure 4:
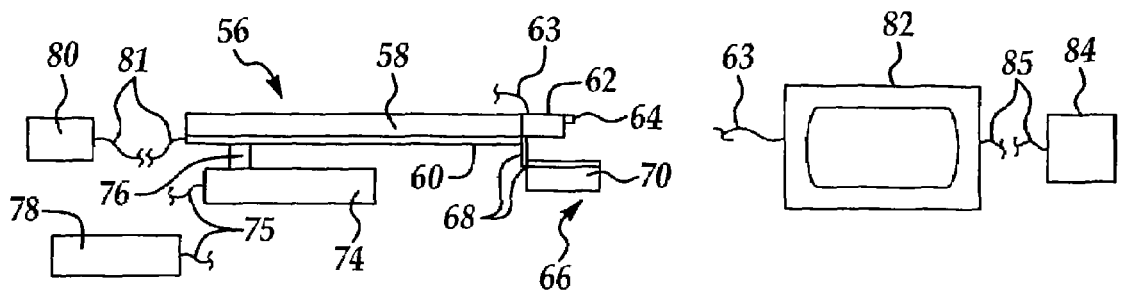
FIG. 4 is a schematic view illustrating typical operational components for the apparatus of the present invention.

Referring to FIGS. 2-4, an integrated cluster tool 30 which includes an illustrative embodiment of the apparatus for visualization of process chamber conditions of the present invention may include one or a pair of adjacent loadlock chambers 32, each of which receives a wafer cassette or holder 33 containing multiple semiconductor wafers 48. An orientation chamber 34 and a cooldown chamber 36 are typically provided on opposite sides of the loadlock chambers 32. Multiple process chambers 38 are positioned around a central transfer chamber 40 with the orientation chamber 34, the cooldown chamber 36 and the loadlock chambers 32. The process chambers 38 may include an etch chamber, a chemical vapor deposition (CVD) chamber, a physical vapor deposition (PVD) chamber, or other type of chamber used to carry out a process in the fabrication of integrated circuits on the wafers 48. A transfer robot 42 in the transfer chamber 40 has multiple transfer blades 44, each of which receives and supports an individual wafer 48 from the wafer cassette or holder 33 in the loadlock chamber 32. The transfer robot 42 is capable of rotating each transfer blade 44 in the clockwise or counter-clockwise direction in the transfer chamber 40, and each transfer blade 44 can extend or retract to facilitate placement and removal of the wafers 48 in and from the load lock chambers 32, the orientation chamber 34, the cooldown chamber 36 and the process chambers 38. As shown in FIG. 3, each process chamber 38 includes an inner wall 39 that faces the interior of the transfer chamber 40. An elongated wafer slot 39a is provided in the inner wall 39, through which wafer slot 39a the transfer robot 42 inserts each wafer 48 into and removes each wafer 48 from the corresponding process chamber 38. It is understood that the integrated cluster tool 30 heretofore described serves as just one example of a cluster tool which is suitable for implementation of the present invention, and the invention may be equally appllicable to cluster tools having alternative characteristics and features which differ from those heretofore described.

In accordance with the present invention, an inspection station 52 is typically attached to the transfer chamber 40 of the integrated cluster tool 30. As shown in FIG. 3, the inspection chamber 52 includes a chamber wall 53 which defines a chamber interior 54 and is attached to the chamber wall 41 of the transfer chamber 40. The chamber interior 54 typically communicates with the interior of the transfer chamber 40 through a chamber opening 55. As shown in FIG. 2, the inspection chamber 52 may be provided between the orientation chamber 34 and one of the process chambers 38 or in any other location which facilitates optimum viewing of the interiors of the process chambers 38 through the respective wafer slots 39a (FIG. 3) thereof, as hereinafter described.

As shown in FIG. 3, a camera assembly 56 is provided in the chamber interior 54 and typically includes an elongated, horizontal camera support 58 which may be engaged by a motion actuating mechanism 74 through a support arm 76. The motion actuating mechanism 74 is provided in the bottom of the chamber interior 54 and may be a stepper motor, for example, or any other mechanism which is capable of moving the camera support 58 in a bidirectional horizontal motion in the chamber interior 54, as indicated by the arrows and in the manner hereinafter described. As shown in FIG. 4, the motion actuating mechanism 74 is electrically connected, through wiring 75, to a motion controller 78 which controls the forward and reverse motions of the camera support 58 in the chamber interior 54.

A camera 62, having a light 64, is provided on the forward end of the camera support 58. In a preferred embodiment, the camera 62 is a panoramic charge coupled device (CCD) which is well known in the art. The camera 62 is connected, through a camera cable 63, to a video monitor 82, as shown in FIG. 4, which video monitor 82 displays images illuminated by the light 64 and viewed by the camera 62. As further shown in FIG. 4, a recording device 84 may be connected to the video monitor 82, typically through a cable 85, for recording of the images on a video cassette recorder (VCR) tape, a digital video disk (DVD), or other recording media.

As further shown in FIGS. 3 and 4, a catch head 66 may be provided on the front end of the camera support 58 for purposes which will be hereinafter described. The catch head 66 includes an electrostatic chuck head 68 which is mounted on the camera support 58, typically beneath the camera 62. The chuck head 68 is provided in electrical contact with an electrically-conductive metal strip 60 provided typically on the bottom surface of the camera support 58. The conductive metal strip 60 is electrically connected through wiring 81 to a voltage source 80. Adhesive tape 70 may be provided on the bottom surface of the chuck head 68. Accordingly, by application of an electrostatic voltage to the chuck head 68 through the conductive strip 60 and the voltage source 80, particles 72 which may flow by air turbulence from the process chambers 38 into the chamber interior 54 may be electrostatically removed from the bottom of the inspection chamber 52 and cling to the adhesive tape 70 of the catch head 66 for subsequent removal therefrom, during operation of the camera assembly 56 as hereinafter further described.

In operation, the integrated cluster tool 30 is used to sequentially process each of multiple wafers 48 during the fabrication of integrated circuits on each wafer 48. The process sequence begins as one of the transfer blades 44 of the transfer robot 42 initially removes a wafer 48 from the wafer cassette 33 and then inserts the wafer 48 in the orientation chamber 34. The transfer robot 42 then transfers the wafer 48 from the orientation chamber 34 sequentially to the respective process chambers 38, where the wafer 48 is sequentially subjected typically to CVD, PVD, etching or other processes. From the last process chamber 38 in the sequence, the transfer robot 42 transfers the wafer 48 to the cooldown chamber 36, and ultimately, back to the wafer cassette or holder 33 in the loadlock chamber 32.

Throughout sequential processing of each wafer 48 in the integrated cluster tool 30, polymer residues (not shown) tend to gradually accumulate in one or more of the process chambers 38. Moreover, mechanical breakdown may also occur in one or more of the process chambers 38. These events potentially induce large or small defects in the wafers 48 being processed therein. Thus, the factors which contribute to these events must be continually monitored to enable facility personnel to take corrective and/or preventative measures and prevent or reduce the number of defects induced in the devices being fabricated on the wafers 48. Accordingly, the camera assembly 56 inside the inspection chamber 52 enables facility personnel to continually visually monitor the interiors of the respective process chambers 38 through the wafer slot 39a (FIG. 3) of each, as follows.

As each of the wafers 48 in a lot is sequentially processed in the respective process chambers 38 in the manner heretofore described, the light 64 on the camera 62 illuminates the interior of the transfer chamber 40, as well as the interiors of the respective process chambers 38 through the wafer slot 39a of each. Accordingly, the camera support 58 is typically advanced from the retracted configuration indicated by the solid lines to the extended configuration indicated by the phantom lines in FIG. 3, wherein the camera support 58 extends through the chamber opening 55 and the camera 62 is positioned in the interior of the transfer chamber 40, to facilitate optimum viewing of the chamber interiors of the respective process chambers 38 in the integrated cluster tool 30. The camera 62 generates images of the interiors of the process chambers 38 and transmits these images to the video monitor 82. Facility personnel visually observing the images on the video monitor 82 can then readily ascertain the excessive accumulation of polymer residues in the interior of each process chamber 38, as well as mechanical breakdown or failure of operational or structural components or abnormal process conditions in the process chambers 38. This enables the personnel to terminate operation of the affected process chamber or chambers 38 and make repairs or take other corrective measures to prevent defects from being induced in the wafers 48 during processing. The images displayed on the video monitor 82 may be simtaneously recorded on the VCR, DVD or other recording medium in the recording device 84. It will be appreciated by those skilled in the art that the typically panoramic viewing capability of the camera 62 facilitates simultaneous visual monitoring of the process conditions inside all of the process chambers 38 in the integrated cluster tool 30. It is understood that the camera 62 may be fitted with a zoom lens or lenses (not shown), as desired, to facilitate close-up viewing of the interior of any one of the process chambers 38, as needed.

As further shown in FIG. 3, it will be appreciated by those skilled in the art that the catch head 66 on the camera assembly 56 may be operated to remove particles 72 which might tend to drift from the process chambers 38, through the transfer chamber 40 and into the chamber interior 54 of the transfer chamber 40. This is accomplished by applying an electrostatic voltage to the conductive strip 60 and electrostatic chuck head 68 by operation of the voltage source 80. Accordingly, the chuck head 68 electrostatically attracts the particles 72, which are lifted from the bottom of the inspection chamber 52 and adhere to the adhesive tape 70. This maintains a substantially particle-free environment inside the chamber interior 54 for optimum operation of the camera 62. The adhesive tape 70 is periodically replaced on the chuck head 68 to remove the particles 72 from the catch head 66.

While the preferred embodiments of the invention have been described above, it will be recognized and understood that various modifications can be made in the invention and the appended claims are intended to cover all such modifications which may fall within the spirit and scope of the invention.

What is claimed is:

1. An apparatus for visualization of conditions in the interior of at least one process chamber, comprising:
    an inspection chamber positioned horizontally adjacent a transfer chamber, said transfer chamber adjacent the at least one process chamber; and
    a camera provided in said inspection chamber, said camera mounted on a camera support, said cameras support adapted to horizontally bi-directionally move within said inspection chamber and said transfer chamber to position said camera to view the interior of the at least one process chamber.

2. The apparatus of claim 1 wherein said camera comprises a charge coupled device.

3. The apparatus of claim 1 further comprising a motion actuating mechanism operably engaging said camera support, said actuating mechanism adapted to horizontally bi-directionally move said camera support in said inspection chamber and said transfer chamber.

4. The apparatus of claim 3, wherein said camera assembly comprises an elongated camera support.

5. The apparatus of claim 1 further comprising an electrostatic catch head carried by said camera, said electrostatic catch head adapted to remove particles from said inspection chamber.

6. The apparatus of claim 1 further comprising a recording device operably connected to said camera for recording images from said camera.

7. The apparatus of claim 1, wherein said camera comprises a light source.

8. The apparatus of claim 1 wherein said camera is a panoramic camera.

9. An apparatus for visualization of conditions in multiple process chambers of an integrated cluster tool having a central transfer chamber, comprising:
    an inspection chamber for positioned adjacent to the transfer chamber; and
    a camera assembly having a camera provided in said inspection chamber, said camera assembly adapted to view the interior of at least one of the process chambers;
    wherein said camera assembly comprises an elongated camera support and a motion actuating mechanism operably engaging said camera support, said actuating mechanism adapted to bidirectionally move said camera support in said inspection chamber and said transfer chamber to view the interior of the least one of said process chambers, and wherein said camera is carried by said camera support.

10. The apparatus of claim 9 further comprising an electrostatic catch head carried by said camera support, said electrostatic catch head adapted to remove particles from said inspection chamber.

11. The apparatus of claim 9 wherein said camera comprises a charge coupled device.

12. The apparatus of claim 9, wherein said camera comprises a light source.

13. The apparatus of claim 9, wherein said camera is a panoramic camera.

14. The apparatus of claim 9, wherein said camera comprises a light source.

15. The apparatus of claim 9 wherein said camera is a panoramic camera.

16. An apparatus for visualization of conditions in multiple process chambers of an integrated cluster tool having a central transfer chamber, comprising:
    an inspection chamber positioned adjacent to the transfer chamber;
    a camera assembly having a camera provided in said inspection chamber said camera mounted on a camera support adapted to horizontally bi-directionally move within said inspection chamber and said transfer chamber to position said camera to view the interior of at least one of the process chambers;
    an electrostatic catch head carried by said camera assembly, said electrostatic catch head adapted to remove particles from said inspection chamber; and
    a voltage source operably connected to said catch head, said voltage source adapted to impart an electrostatic charge to said catch head.

17. The apparatus of claim 16 wherein said camera support comprises an elongated camera support and a motion actuating mechanism operably engaging said camera support, said actuating mechanism adapted for said horizontal bidirectional movement of said camera support in said inspection chamber, and wherein said camera and said catch head are carried by said camera support.

18. The apparatus of claim 16 wherein said camera comprises a charge coupled device.

19. The apparatus of claim 16 further comprising a recording device operably connected to said camera for recording images from said camera.

20. The apparatus of claim 16, wherein said camera comprises a light source.

* * * * *